United States Patent
Zhang et al.

(10) Patent No.: US 12,364,009 B2
(45) Date of Patent: Jul. 15, 2025

(54) METHOD FOR PREPARING ARRAY SUBSTRATE AND ARRAY SUBSTRATE

(71) Applicants: CHONGQING ADVANCE DISPLAY TECHNOLOGY RESEARCH, Chongqing (CN); CHONGQING HKC OPTOELECTRONICS TECHNOLOGY CO., LTD., Chongqing (CN)

(72) Inventors: Hejing Zhang, Chongqing (CN); Zhen Liu, Chongqing (CN)

(73) Assignees: CHONGQING ADVANCE DISPLAY TECHNOLOGY RESEARCH, Chongqing (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 63 days.

(21) Appl. No.: 17/800,337

(22) PCT Filed: Dec. 29, 2021

(86) PCT No.: PCT/CN2021/142755
§ 371 (c)(1),
(2) Date: Aug. 17, 2022

(87) PCT Pub. No.: WO2022/183822
PCT Pub. Date: Sep. 9, 2022

(65) Prior Publication Data
US 2024/0297188 A1    Sep. 5, 2024

(30) Foreign Application Priority Data
Mar. 1, 2021    (CN) .......................... 202110223720.4

(51) Int. Cl.
*H10D 86/01*    (2025.01)
*H10D 86/40*    (2025.01)
*H10D 86/60*    (2025.01)

(52) U.S. Cl.
CPC ....... *H10D 86/0231* (2025.01); *H10D 86/441* (2025.01); *H10D 86/60* (2025.01)

(58) Field of Classification Search
CPC .. H10D 86/0231; H10D 86/441; H10D 86/60; H10D 10/821; H10D 64/511;
(Continued)

(56) References Cited

U.S. PATENT DOCUMENTS 7,858,412 B2 * 12/2010 Kim .................. H10D 86/0231
                                                    257/E21.414
8,349,737 B2 *  1/2013 Lim ....................... H10D 86/40
                                                    438/670
(Continued)

FOREIGN PATENT DOCUMENTS

CN         1645227 A     7/2005
CN      2007305937 A    11/2007
(Continued)

OTHER PUBLICATIONS

International Search Report issued on Mar. 16, 2022 in corresponding International application No. PCT/CN2021/142755; 4 pages.

*Primary Examiner* — J. E. Schoenholtz
(74) *Attorney, Agent, or Firm* — Maier & Maier, PLLC

(57) ABSTRACT

A method for preparing an array substrate and an array substrate. The method for preparing an array substrate includes: depositing a first metal layer, an insulating layer, an active layer and a doping layer on the substrate; forming a photoresist on doping layer by using a first photomask process, and etching the photoresist to form a gate and a channel; depositing a second metal layer on the substrate; using the second photomask process to form the source-
(Continued)

drain metal layer; depositing a passivation layer on the substrate; using the third photomask process to form a pixel electrode layer.

16 Claims, 4 Drawing Sheets

(58) Field of Classification Search
CPC ...... H10D 86/021; H10D 84/953; A23B 2/20; Y02P 70/50; H01L 21/77; H10H 20/8142
See application file for complete search history.

(56) References Cited

U.S. PATENT DOCUMENTS

| | | | |
|---|---|---|---|
| 9,530,808 B2* | 12/2016 | Jiang | H01L 29/66765 |
| 2004/0129943 A1* | 7/2004 | Yoo | H10D 86/40 |
| | | | 438/149 |
| 2009/0233389 A1* | 9/2009 | Miyairi | H10D 86/0231 |
| | | | 257/E21.414 |
| 2014/0077207 A1* | 3/2014 | Gao | H10D 86/60 |
| | | | 257/43 |
| 2015/0349141 A1 | 12/2015 | Jiang | |
| 2016/0211277 A1* | 7/2016 | Yan | H10D 30/6746 |
| 2019/0058165 A1* | 2/2019 | Xu | G03F 7/16 |
| 2019/0355836 A1 | 11/2019 | Liu | |
| 2021/0225902 A1* | 7/2021 | Zhu | H10D 86/0231 |

FOREIGN PATENT DOCUMENTS

| | | |
|---|---|---|
| CN | 101533780 A | 9/2009 |
| CN | 101645417 A | 2/2010 |
| CN | 102033379 A | 4/2011 |
| CN | 102044490 A | 5/2011 |
| CN | 104716091 A | 6/2015 |
| CN | 105789119 A | 7/2016 |
| CN | 105870058 A | 8/2016 |
| CN | 106206428 A | 12/2016 |
| CN | 106252217 A | 12/2016 |
| CN | 107204309 A | 9/2017 |
| CN | 108573928 A | 9/2018 |
| CN | 109411485 A | 3/2019 |
| CN | 111048525 A | 4/2020 |
| CN | 111129037 A | 5/2020 |
| CN | 111129038 A | 5/2020 |
| CN | 112071867 A | 12/2020 |
| CN | 113013096 A | 6/2021 |
| KR | 20040026768 A | 4/2004 |
| WO | 2020082501 A1 | 4/2020 |

* cited by examiner

METHOD FOR PREPARING ARRAY SUBSTRATE AND ARRAY SUBSTRATE

CROSS-REFERENCE TO RELATED APPLICATIONS

The present application is a national phase of International Patent Application No. PCT/CN2021/142755 with an international filing date of Dec. 29, 2021, designating the United States, now pending and further claims the priority of the Chinese patent application NO. 202110223720.4 entitled "Method for preparing array substrate and array substrate", which was filed with the Chinese Patent Office on Mar. 1, 2021, the entire contents of which are incorporated by reference in the present application.

TECHNICAL FIELD

The present application relates to the technical field of display manufacturing, in particular, to a method for preparing an array substrate and an array substrate.

BACKGROUND

The statements herein merely provide background information related to the present application and do not necessarily constitute prior art.

Amorphous silicon semiconductor thin film transistor (TFT) displays are currently the most widely used displays due to their low cost and stable process.

In order to reduce costs and improve production efficiency, current TFT displays have gradually developed from an initial five-photomask manufacturing process to a four-photomask manufacturing process and a three-photomask manufacturing process. However, in the three-photomask manufacturing process, the active layer is inevitably protruded on both sides below the second metal layer, thereby affecting the light leakage of the TFT and the resolution of the panel.

SUMMARY

One purpose of the examples of the present application is to provide a method for preparing an array substrate and an array substrate.

The technical scheme adopted in the example of the present application is as follows:

In the first aspect, a method for preparing an array substrate is provided, including the following steps: first deposition, first photomask, second deposition, second photomask, third deposition and third photomask. The first deposition includes depositing a first metal layer, an insulating layer, an active layer and a doping layer on a substrate in sequence. The first photomask includes forming a photoresist on the doped layer by a first photomask process, and forming a gate and a channel by etching the first metal layer, the insulating layer, the active layer, and the doped layer. The second deposition includes depositing a second metal layer on the substrate. The second photomask includes: forming a source-drain metal layer by using a second mask process to pattern the second metal layer. The third deposition includes depositing a passivation layer on the substrate. The third photomask includes forming a pixel electrode pattern by using a third photomask process to pattern the passivation layer, and forming a pixel electrode layer on the passivation layer according to the pixel electrode pattern.

In one embodiment, the first photomask, specifically includes the followings steps: etching the doping layer, the active layer, the insulating layer and the first metal layer, respectively; exposing and developing the photoresist, and removing the photoresist to form the gate and the channel.

In one embodiment, in the step of etching the doping layer, the active layer, the insulating layer and the first metal layer, respectively: an etching processing method of the doping layer, the active layer and the insulating layer is dry etching; an etching method of the first metal layer is wet etching.

In one embodiment, the step of after exposing and developing the photoresist, removing the photoresist to form the gate and the channel, specifically comprising the following steps: removing the photoresist for the first time to retain the photoresist on the doping layer facing a thin film transistor area; etching the doping layer facing the thin film transistor area to form the channel; removing the photoresist remaining on the doping layer for the second time to form the gate.

In one embodiment, in the step of removing the photoresist for the first time to retain the photoresist on the doping layer facing a thin film transistor area, removing the photoresist for the first time is completed in the same process.

In one embodiment, in the step of removing the photoresist remaining on the doping layer for the second time to form the gate, irradiating the two photoresists located on both sides of the channel with light by means of a mask and removing the two photoresists by the developer.

In one embodiment, the removing the two photoresists located on both sides of the channel is completed in the same process.

In one embodiment, in the step of etching the doping layer facing the thin film transistor area to form the channel, an etching method of the doping layer is dry etching.

In one embodiment, a thin film transistor area, a storage capacitor area, a pixel area, a through hole area and a binding area are arranged on the substrate at intervals; the first metal layer, the insulating layer, the active layer, the doping layer and the second metal layer are arranged on the thin film transistor area in sequence; the first metal layer, the insulating layer, the active layer and the second metal layer are arranged on the storage capacitor area in sequence; the first metal layer, the insulating layer, the active layer and the second metal layer are arranged on the through hole area in sequence; the first metal layer, the insulating layer and the active layer are arranged on the binding area in sequence; the passivation layer covers the substrate.

In one embodiment, a first spacing area is formed at intervals between the photoresist facing the thin film transistor area and the photoresist facing the storage capacitor area; a second spacing area is formed at intervals between the photoresist facing the storage capacitor area and the photoresist facing the through hole area, the second spacing area facing the pixel area; a third spacing area is formed at intervals between the photoresist facing the through hole area and the photoresist facing the binding area, and the etching of the first spacing area, the second spacing area and the third spacing area are completed in the same dry etching process.

In one embodiment, the first metal layer in the first spacing area, the first metal layer in the second spacing area and the first metal layer in the third spacing area are completed in the same wet etching process.

In one embodiment, the second metal layer facing the thin film transistor area, the second metal layer facing the storage capacitor area, and the two second metal layer facing the through hole area are formed in the same process.

In one embodiment, in the step of third photomask: the passivation layer and the pixel electrode layer are respectively formed by a photoresist lift-off technique.

In one embodiment, the active layer is an amorphous silicon layer.

In one embodiment, the pixel electrode layer is an indium tin oxide layer.

In one embodiment, the insulating layer is silicon oxide or silicon nitride.

In the second aspect, an array substrate is provided, which is obtained by the method for preparing an array substrate of the above embodiments. The array substrate includes:
  a substrate;
  a first metal layer arranged on the substrate;
  an insulating layer arranged on the first metal layer;
  an active layer arranged on the insulating layer;
  a doping layer arranged on the insulating layer facing the thin film transistor area;
  second metal layers, where the second metal layers are divided into two groups, one group of the second metal layers are arranged on the doping layer to form a source-drain metal layer, and the other group of the second metal layers are arranged on the active layer;
  a passivation layer arranged on the second metal layer, the channel and the active layer;
  a pixel electrode layer connected to the first metal layer and the second metal layer, respectively.

The beneficial effects of the method for preparing the array substrate provided by the examples of the present application are summarized as follows: a gate and a channel are formed by first photomask process. A source-drain metal layer is formed by second photomask process. A passivation layer and a pixel electrode layer are formed by third photomask process. The second metal layer is deposited between the first photomask process and the second photomask process, so that the active layer can be prevented from protruding on both sides below the second metal layer, thereby reducing the light leakage of the TFT and improving the resolution of the panel.

Moreover, the present application prepares the array substrate through three photomask processes, which can reduce the process flow and improve the production efficiency.

The beneficial effect of the array substrate provided by the example of the present application is that the array substrate prepared by the method for preparing the array substrate shortens the process time and helps to improve the production efficiency.

BRIEF DESCRIPTION OF THE DRAWINGS

In order to illustrate the technical solutions in the examples of the present application more clearly, the following briefly introduces the accompanying drawings that are used in the description of the examples or exemplary technologies. Obviously, the drawings in the following description are only for the present application. In some examples, for those of ordinary skill in the art, other drawings can also be obtained according to these drawings without any creative effort.

DETAILED DESCRIPTION OF THE EMBODIMENTS

Figure 1:
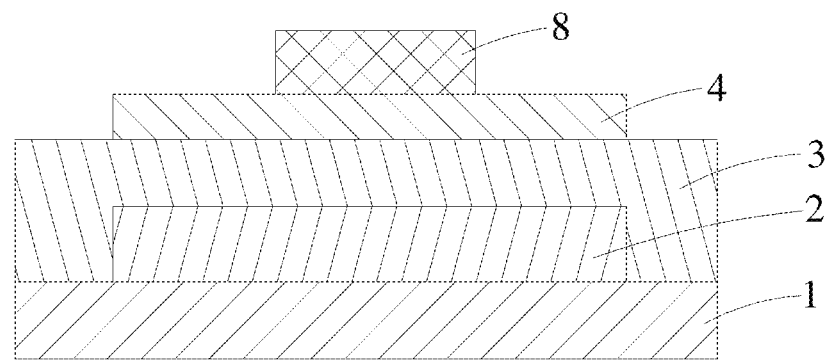
FIG. 1 is a schematic structural diagram of the array substrate provided by the comparative example of this application.

In order to make the purpose, technical solutions and advantages of the present application more clearly understood, the present application will be described in further detail below with reference to the accompanying drawings and examples. It should be understood that the specific examples described herein are only used to explain the present application, but not to limit the present application.

It should be noted that when a component is referred to as being "fixed to" or "disposed on" another component, it can be directly on the other component or indirectly on the other component. When an element is referred to as being "connected to" another element, it can be directly or indirectly connected to the other element.

The orientation or positional relationship indicated by the terms "upper", "lower", "left", "right", is based on the orientation or positional relationship shown in the drawings, and is only for the convenience of description, rather than indicating or implying the referred device or the elements must have a specific orientation, or be constructed and operated in a specific orientation, and therefore should not be construed as a limitation on the present application, and those of ordinary skill in the art can understand the specific meanings of the above terms according to specific situations.

The terms of "first", "second" and "third" are only used for convenience of description, and should not be construed as indicating or implying relative importance or implying the number of technical features. "A plurality of" means two or more, unless expressly specifically limited otherwise.

In order to illustrate the technical solutions provided by the present application, the following detailed description is given with reference to the specific drawings and examples. Referring to FIG. 1, in the current three-step photomask manufacturing process, the active layer 4 is inevitably protruded on both sides below the second metal layer 8, thereby affecting the light leakage of the TFT and the resolution of the panel. Based on this, the examples of the present application provide a method for preparing an array substrate to solve the above problems.

Figure 2:
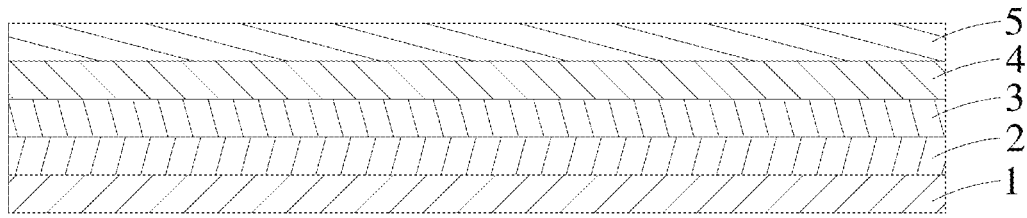
FIG. 2 is a schematic structural diagram of the array substrate provided in the example of the present application in the first deposition step.

The method for preparing the array substrate provided in the example of the present application will now be described. The method for preparing the array substrate includes the following steps:

S1) First deposition: referring to FIG. 2, a first metal layer 2, an insulating layer 3, an active layer 4 and a doping layer 5 were deposited on the substrate 1 in sequence. The insulating layer 3 can be silicon oxide or silicon nitride, etc.; the active layer 4 can be an amorphous silicon layer, which is not limited herein.

Figure 3:
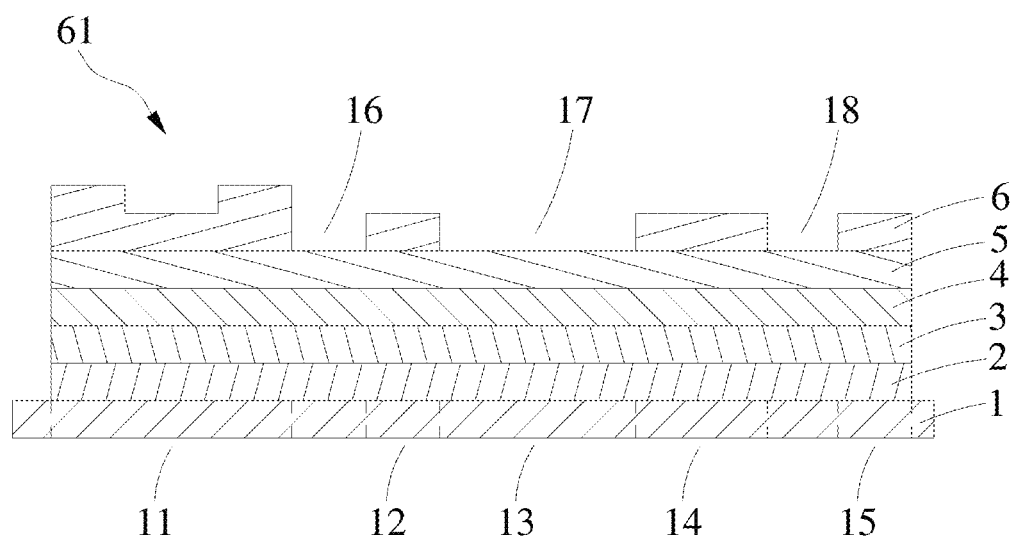
FIG. 3 is a first schematic structural diagram of the array substrate in the first photomask step provided by the example of the present application.
Figure 4:
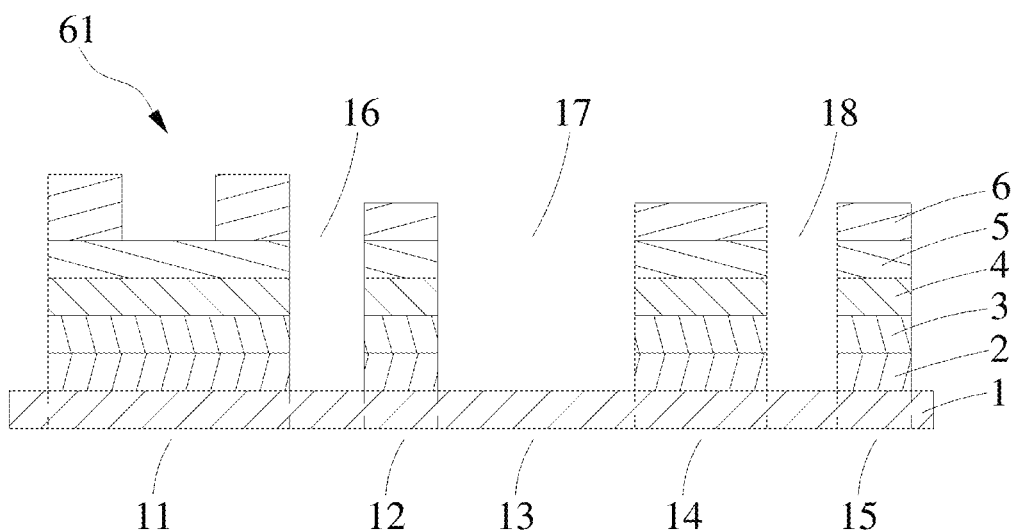
FIG. 4 is a second schematic structural diagram of the array substrate provided in the example of the present application in the first photomask step.
Figure 5:
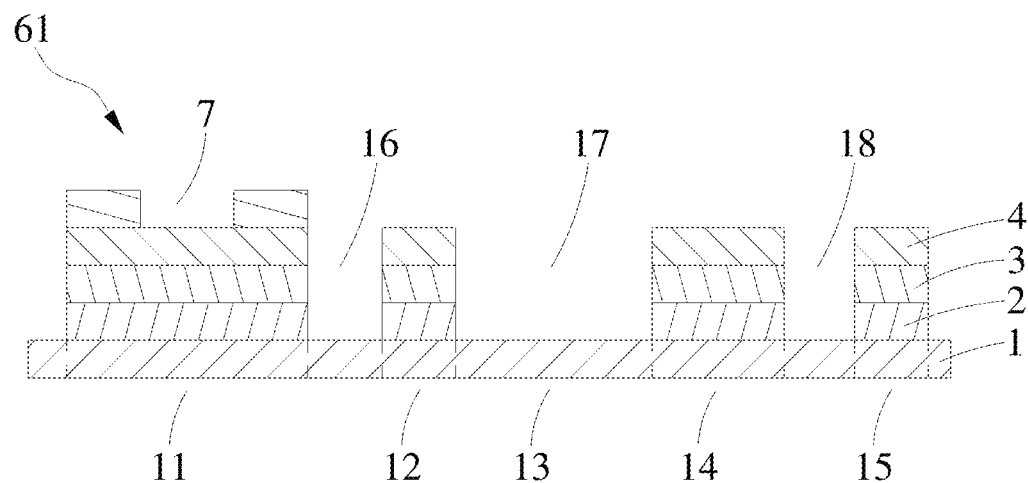
FIG. 5 is a third schematic structural diagram of the array substrate in the first photomask step provided by the example of the present application.

S2) First photomask: referring to FIG. 3 to FIG. 5. The first photomask process is used to form photoresist 6 on the doping layer 5. The first metal layer 2, the insulating layer 3, the active layer 4, the doping layer 5 and the photoresist 6 were etched to form a gate 61 and a channel 7 respectively. The first photomask process may be a second-order photomask, such as a halftone mask (HTM), a half-gray photomask, etc., which is not limited here.

Specifically, thin film transistor area 11, storage capacitor area 12, pixel area 13, through hole area 14 and binding area 15 were arranged at intervals the substrate 1. S1) In the first deposition step, the first metal layer 2, the insulating layer 3, the active layer 4 and the doping layer 5 deposited in sequence on the substrate 1 all cover the thin film transistor area 11, the storage capacitor area 12, the pixel area 13, the through hole area 14 and the binding area 15. In the first photomask step of S2), the first photomask process was used to form the photoresist 6 on the doping layer 5. Specifically, the photoresist 6 was formed on the doping layer 5 facing the thin film transistor area 11, and the photoresist 6 was formed on the doping layer 5 facing the storage capacitor area 12. The photoresist 6 was formed on doping layer 5 facing through hole area 14, and the photoresist 6 was formed on doping layer 5 facing binding area 15. The space between adjacent photoresist 6 was arranged to facilitate subsequent etching processing of the first metal layer 2, the insulating layer 3, the active layer 4 and the doping layer 5, respectively.

Referring to FIG. 4 and FIG. 5, the etching process of the first metal layer 2, the insulating layer 3, the active layer 4, the doping layer 5 and the photoresist 6 respectively were as follows: S21) the doping layer 5, the active layer 4, the insulating layer 3 and the first metal layer 2 were respectively etched; S22) After the photoresist 6 was exposed and developed, the photoresist 6 was removed to form the gate 61 and the channel 7. The first spacing area 16 was formed between the photoresist 6 facing the thin film transistor area 11 and the photoresist 6 facing the storage capacitor area 12. The second spacing area 17 was formed between the photoresist 6 facing the storage capacitor area 12 and the photoresist 6 facing the through hole area 14. The second spacing area 17 faces the pixel area 13. A third spacing area 18 was formed between photoresist 6 facing through hole area 14 and the photoresist 6 facing the binding area 15.

Referring to FIG. 3 and FIG. 4, in step of S21, the doping layer 5, the active layer 4 and the insulating layer 3 located in the first spacing area 16 were etched in sequence by dry etching, and the doping layer 5 and the active layer 4 located in the second spacing area 17 were etched by dry etching. The doping layer 5, the active layer 4 and the insulating layer 3 located in the third spacing area 18 were etched away in sequence by dry etching. The etching for the first spacing area 16, the second spacing area 17 and the third spacing area 18 can be completed in the same dry etching process, which helps to improve efficiency. Subsequently, the first metal layer 2 located in the first spacing area 16 was etched away by wet etching, the first metal layer 2 located in the second spacing area 17 was etched away, and the first metal layer 2 located in the third spacing area 18 was etched away. The first metal layer 2 in the first spacing area 16, the first metal layer 2 in the second spacing area 17, and the first metal layer 2 in the third spacing area 18 can be completed in the same wet etching process.

Referring to FIG. 4 and FIG. 5, in step S22, the following steps may be specifically included:

S221) The photoresist 6 was removed for the first time to keep the photoresist 6 on the doping layer 5 facing the thin film transistor area 11. Specifically, the photoresist 6 located in channel 7 was irradiated with light by means of a mask, and the photoresist 6 was removed by the developer. The photoresist 6 located on both sides of channel 7 was reserved; the photoresist 6 facing through hole area 14 was irradiated with light by means of a mask, and the photoresist 6 was removed by developing solution; the photoresist 6 facing binding area 15 was irradiated with light by means of a mask, and the photoresist 6 was removed by developer. The photoresist 6 located in the channel 7, the photoresist 6 facing the storage capacitor area 12, the photoresist 6 facing the through hole area 14 and the photoresist 6 facing the binding area 15 can be removed in the same process.

S222) The doping layer 5 facing the thin film transistor area 11 was etched to form the channel 7. Referring to FIG. 4 and FIG. 5. Specifically, in the thin film transistor area 11, when the doping layer 5 was etched, the doping layer 5 located between the two photoresist 6 was etched away due to the blockage by the photoresist 6 located on both sides of the channel 7. The etching method for the doping layer 5 facing the thin film transistor area 11 was dry etching.

S223) The remaining photoresist 6 on the doping layer 5 was removed for the second time to form the gate 61. Specifically, two photoresist 6 located on both sides of channel 7 were irradiated with light by means of a mask, and the photoresist 6 was removed by a developer. The removal of the two photoresist 6 on both sides of channel 7 can be done in the same process.

Through the first photomask step of S2), the gate 61 and the channel 7 were formed in thin film transistor area 11, and the process structures of the storage capacitor area 12, the pixel area 13, the through hole area 14 and the binding area 15 were improved.

Figure 6:
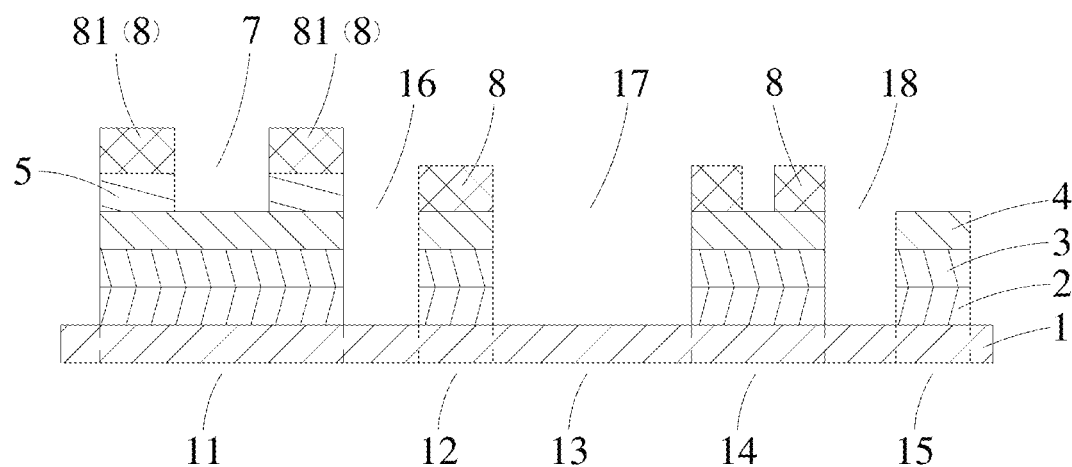
FIG. 6 is a schematic structural diagram of the array substrate provided in the example of the present application in the second deposition and second photomask steps.

S3) Second deposition: a second metal layer 8 was deposited on the substrate 1. Referring to FIG. 6, specifically, the second metal layer 8 was deposited on doping layer 5 located on both sides of channel 7, the second metal layer 8 was deposited on active layer 4 facing storage capacitor area 12, and two second metal layers 8 were deposited on active layer 4 facing through hole area 14 at intervals. The second metal layer 8 facing the thin film transistor area 11, the second metal layer 8 facing the storage capacitor area 12, and the two second metal layers 8 facing the through hole area 14 can be formed in the same process.

S4) Second photomask: the second photomask process was used to pattern the second metal layer 8 to form the source-drain metal layer 81. Specifically, the second metal layer 8 was exposed, developed and etched through a common mask, and the source and drain electrodes of the thin film transistor (that is, the source-drain metal layer 81) were formed respectively on the two second metal layers 8 arranged at intervals facing the thin film transistor area 11. The edge of the source electrode was aligned with and opposite to the edge of the doping layer 5, and the edge of the drain electrode was aligned with and opposite to the edge of the doping layer 5, so as to avoid the protruding active layer 4 on both sides below the second metal layer 8, thereby reducing TFT light leakage and improving the resolution of the panel. The other pole of the storage capacitor was formed with respect to the second metal layer 8 of the storage capacitor area 12. The second photomask process can be a common photomask, which was not limited here.

Figure 7:
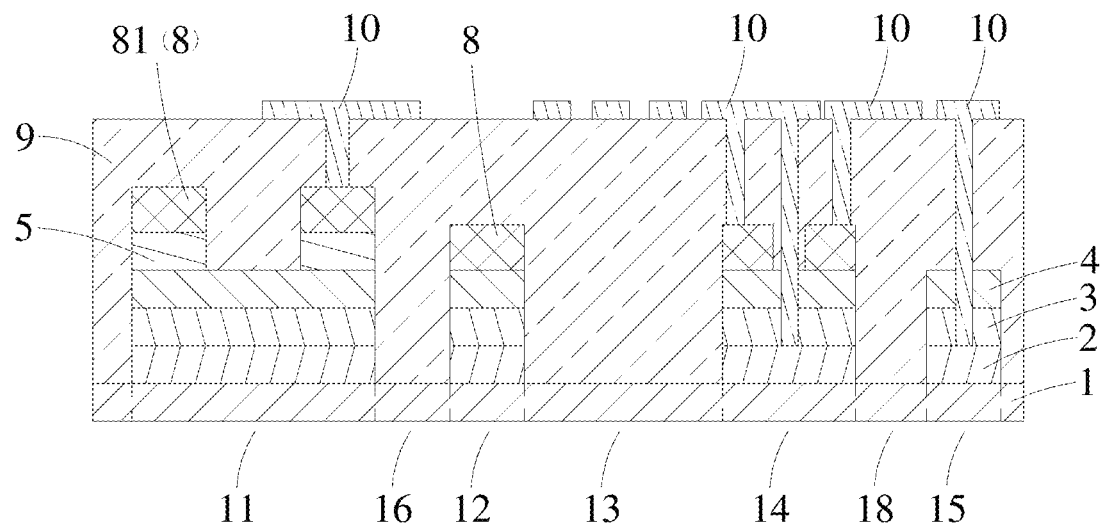
FIG. 7 is a schematic structural diagram of the array substrate provided in the example of the present application in the third deposition and third photomask steps.

S5) Third deposition: the passivation layer 9 was deposited on the substrate 1. Referring to FIG. 7, specifically, the passage layer 9 can fill the channel 7, the first spacing area 16, the second spacing area 17, the gap between the second metal layers 8 facing the through hole area 14 and arranged at intervals and the third spacing area 18. In the traditional photomask manufacturing process, there were generally an insulating layer 3 and a passivation layer 9 on the pixel area 13. Due to the existence of the two-layer structure, light will be refracted or reflected at the interface junction, thereby affecting the display quality. However, in this structure, the pixel area 13 processed by the second photomask process and S5) third deposition has only the passivation layer 9, so the phenomenon of light refraction or reflection caused by the combination of the passivation layer 9 and other layers can be avoided, thereby helping to improve the display quality. The material of the passivation layer 9 may be oxide, nitride or oxynitride, which was not limited herein.

S6) Third photomask: the third photomask process was used to pattern the passivation layer 9 to form a pixel electrode pattern, and the pixel electrode layer 10 was formed on the passivation layer 9 according to the pixel electrode pattern. Referring to FIG. 7, specifically, the passivation layer 9 and the pixel electrode layer 10 were respectively formed by photoresist lift-off technique. And the pixel electrode layer 10 facing the thin film transistor area 11 was connected to the second metal layer 8 on the channel 7 side; there are two pixel electrode layers 10 facing the through hole area 14, one end of the pixel electrode layer 10 was connected to the first metal layer 2, the other end of the pixel electrode layer 10 was connected to one second metal layer 8, and the other pixel electrode layer 10 was connected to the other second metal layer 8; the pixel electrode layer 10 facing the binding area 15 was connected with the first metal layer 2.

The pixel electrode layer 10 was an indium tin oxide (ITO) layer. The third photomask manufacturing process can be a second-order photomask, such as HTM, half-gray dimming mask, etc., which was not limited herein.

Referring to FIG. 7, an example of the present application further provides an array substrate, which was prepared by the above-mentioned method for preparing an array substrate. The array substrate includes a substrate 1, a first metal layer 2, an insulating layer 3, an active layer 4, a doping layer 5, second metal layers 8, a passivation layer 9 and a pixel electrode layer 10. Specifically, the thin film transistor area 11, the first spacing area 16, the storage capacitor area 12, the pixel area 13 (facing second spacing area 17), the through hole area 14, the third spacing area 18, and the binding area 15 were spaced on the substrate 1. A first metal layer 2 was provided on the thin film transistor area 11, the storage capacitor area 12, the through hole area 14, and the binding area 15, respectively. And an insulating layer 3 and an active layer 4 were provided on each of the first metal layers 2 in sequence. Two doping layers 5 were arranged at intervals on the active layer 4 facing the thin film transistor area 11, and second metal layers 8 was arranged on each doping layer 5, and formed the source and drain electrodes of the thin film transistor (ie source-drain metal layer 81) respectively. The channel 7 was formed between the source and the drain. Second metal layers 8 were provided on the active layer 4 facing the storage capacitor area 12, and form the other pole of the storage capacitor. Two second metal layers 8 were provided at intervals on the active layer 4 facing the through hole area 14. The passivation layer 9 was arranged on the substrate 1 and covered the first metal layer 2, the insulating layer 3, the active layer 4, the doping layer 5 and the second metal layer 8. The pixel electrode layer 10 was arranged on the passivation layer 9 and was connected to the first metal layer 2 and the second metal layer 8 through contact holes, respectively.

It should be understood that the numbers of the sequence of the steps in the above examples does not mean the sequence of execution, and the execution sequence of each process should be determined by its function and internal logic, and should not constitute any limitation to the implementation process of the examples of the present application.

The above are only optional examples of the present application, and are not intended to limit the present application. Various modifications and variations of this application are possible for those skilled in the art. Any modification, equivalent replacement, improvement, etc. made within the spirit and principle of this application shall be within the scope of the claims of this application.

What is claimed is:

1. A method for preparing an array substrate, comprising the following steps:
    first deposition, comprising: depositing a first metal layer, an insulating layer, an active layer and a doping layer on a substrate in sequence;
    first photomask, comprising: forming a photoresist on the doped layer by a first photomask process, and forming a gate and a channel by etching the first metal layer, the insulating layer, the active layer, and the doped layer;
    second deposition, comprising: depositing a second metal layer on the substrate;
    second photomask, comprising: forming a source-drain metal layer by using a second mask process to pattern the second metal layer;
    third deposition, comprising: depositing a passivation layer on the substrate; and
    third photomask, comprising: forming a pixel electrode pattern by using a third photomask process to pattern the passivation layer, and forming a pixel electrode layer on the passivation layer according to the pixel electrode pattern.

2. The method for preparing the array substrate according to claim 1, wherein the first photomask, comprises the followings steps:
    etching the doping layer, the active layer, the insulating layer and the first metal layer, respectively;
    exposing and developing the photoresist, and removing the photoresist to form the gate and the channel.

3. The method for preparing the array substrate according to claim 2, wherein in the step of etching the doping layer, the active layer, the insulating layer and the first metal layer, respectively: an etching method of the doping layer, the active layer and the insulating layer is dry etching; and an etching method of the first metal layer is wet etching.

4. The method for preparing the array substrate according to claim 2, wherein the step of after exposing and developing the photoresist, removing the photoresist to form the gate and the channel, comprises the following steps:
    removing the photoresist for a first time to retain the photoresist on the doping layer facing a thin film transistor area;

etching the doping layer facing the thin film transistor area to form the channel; and removing the photoresist remaining on the doping layer for a second time to form the gate.

5. The method for preparing an array substrate according to claim 4, wherein in the step of removing the photoresist for the first time to retain the photoresist on the doping layer facing a thin film transistor area, and removing the photoresist for the first time is completed in the same process.

6. The method for preparing an array substrate according to claim 4, wherein in the step of removing the photoresist remaining on the doping layer for the second time to form the gate, the two photoresists located on both sides of the channel are irradiated with light by means of a mask and removed by the developer.

7. The method for preparing an array substrate according to claim 6, wherein the removing the two photoresists located on both sides of the channel is completed in the same process.

8. The method for preparing the array substrate according to claim 4, wherein in the step of etching the doping layer facing the thin film transistor area to form the channel, an etching method of the doping layer is dry etching.

9. The method for preparing the array substrate according to claim 1, wherein
a thin film transistor area, a storage capacitor area, a pixel area, a through hole area and a binding area are arranged on the substrate at intervals; the first metal layer, the insulating layer, the active layer, the doping layer and the second metal layer are arranged on the thin film transistor area in sequence;

the first metal layer, the insulating layer, the active layer and the second metal layer are arranged on the storage capacitor area in sequence;

the first metal layer, the insulating layer, the active layer and the second metal layer are arranged on the through hole area in sequence;

the first metal layer, the insulating layer and the active layer are arranged on the binding area in sequence; and the passivation layer covers the substrate.

10. The method for preparing the array substrate according to claim 9, wherein
a first spacing area is formed at intervals between the photoresist facing the thin film transistor area and the photoresist facing the storage capacitor area;

a second spacing area is formed at intervals between the photoresist facing the storage capacitor area and the photoresist facing the through hole area, the second spacing area facing the pixel area; and a third spacing area is formed at intervals between the photoresist facing the through hole area and the photoresist facing the binding area, and the etching of the first spacing area, the second spacing area and the third spacing area are completed in the same dry etching process.

11. The method for preparing the array substrate according to claim 10, wherein the first metal layer in the first spacing area, the first metal layer in the second spacing area and the first metal layer in the third spacing area are completed in the same wet etching process.

12. The method for preparing the array substrate according to claim 9, wherein the second metal layer facing the thin film transistor area, the second metal layer facing the storage capacitor area, and the two second metal layer facing the through hole area are formed in the same process.

13. The method for preparing the array substrate according to claim 1, wherein, in the step of third photomask: the passivation layer and the pixel electrode layer are respectively formed by a photoresist lift-off technique.

14. The method for preparing the array substrate according to claim 1, wherein the active layer is an amorphous silicon layer.

15. The method for preparing the array substrate according to claim 1, wherein the pixel electrode layer is an indium tin oxide layer.

16. The method for preparing the array substrate according to claim 1, wherein the insulating layer is silicon oxide or silicon nitride.

* * * * *